(12) United States Patent
Dascher

(10) Patent No.: US 7,053,750 B2
(45) Date of Patent: May 30, 2006

(54) VOLTAGE PROBE SYSTEMS HAVING IMPROVED BANDWIDTH CAPABILITY

(75) Inventor: David J Dascher, Monument, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/156,896

(22) Filed: May 29, 2002

(65) Prior Publication Data

Related U.S. Application Data

(63) Continuation-in-part of application No. 10/125,002, filed on Apr. 18, 2002.

(51) Int. Cl.
*H01C 1/02* (2006.01)

(52) U.S. Cl. .................. 338/329; 338/214; 338/216; 324/754

(58) Field of Classification Search ............. 338/216, 338/229, 214; 324/754, 158, 755, 765, 158.1; 29/613
See application file for complete search history.

(56) References Cited

U.S. PATENT DOCUMENTS

| | | | | |
|---|---|---|---|---|
| 755,382 A | * | 3/1904 | Oliver | 338/177 |
| 2,452,737 A | * | 11/1948 | Eisenstein et al. | 338/216 |
| 2,496,541 A | * | 2/1950 | Johnson, Jr. | 324/95 |
| 2,790,051 A | * | 4/1957 | Sicho | 200/567 |
| 2,834,858 A | * | 5/1958 | Schaschl | 338/13 |
| 2,974,403 A | * | 3/1961 | Dolin et al. | 29/613 |
| 3,317,830 A | * | 5/1967 | Winningstad | 324/72.5 |
| 4,139,817 A | * | 2/1979 | Boer et al. | 324/72.5 |
| 4,638,268 A | * | 1/1987 | Watanabe et al. | 333/22 F |
| 4,791,363 A | * | 12/1988 | Logan | 324/754 |
| 4,978,907 A | * | 12/1990 | Smith | 324/72.5 |
| 5,042,294 A | * | 8/1991 | Uzzell | 73/75 |
| 5,319,858 A | * | 6/1994 | Coy | 33/561 |
| 5,428,204 A | * | 6/1995 | Uhling et al. | 219/121.68 |
| 5,604,436 A | * | 2/1997 | Henritzy et al. | 324/414 |
| 5,748,002 A | * | 5/1998 | Scott et al. | 324/633 |
| 6,049,219 A | * | 4/2000 | Hwang et al. | 324/765 |
| 6,323,638 B1 | * | 11/2001 | McNulty | 324/149 |
| 6,407,562 B1 | * | 6/2002 | Whiteman | 324/754 |
| 6,459,252 B1 | * | 10/2002 | Bierer | 324/72.5 |
| 6,573,699 B1 | * | 6/2003 | Hama et al. | 324/96 |
| 6,688,906 B1 | * | 2/2004 | Kimbley | 439/482 |
| 2002/0113612 A1 | * | 8/2002 | Nguyen | 324/761 |
| 2003/0041650 A1 | * | 3/2003 | Dimarzo et al. | 73/25.01 |
| 2003/0197517 A1 | * | 10/2003 | Kimbley | 324/715 |

OTHER PUBLICATIONS

IBMTDB NN700999#"AC/DC Coaxial Probe", vol. 13, Is No. 4, p. 993 (Sep. 1970).*

* cited by examiner

*Primary Examiner*—Tu Hoang

(57) ABSTRACT

A resistive pin for use in a voltage probe includes a pin-head that is configured to contact a test point in a device under test, and a resistor that is attached to the pin-head. Other systems are also provided for establishing electrical connections between testing instruments and devices under test.

12 Claims, 15 Drawing Sheets

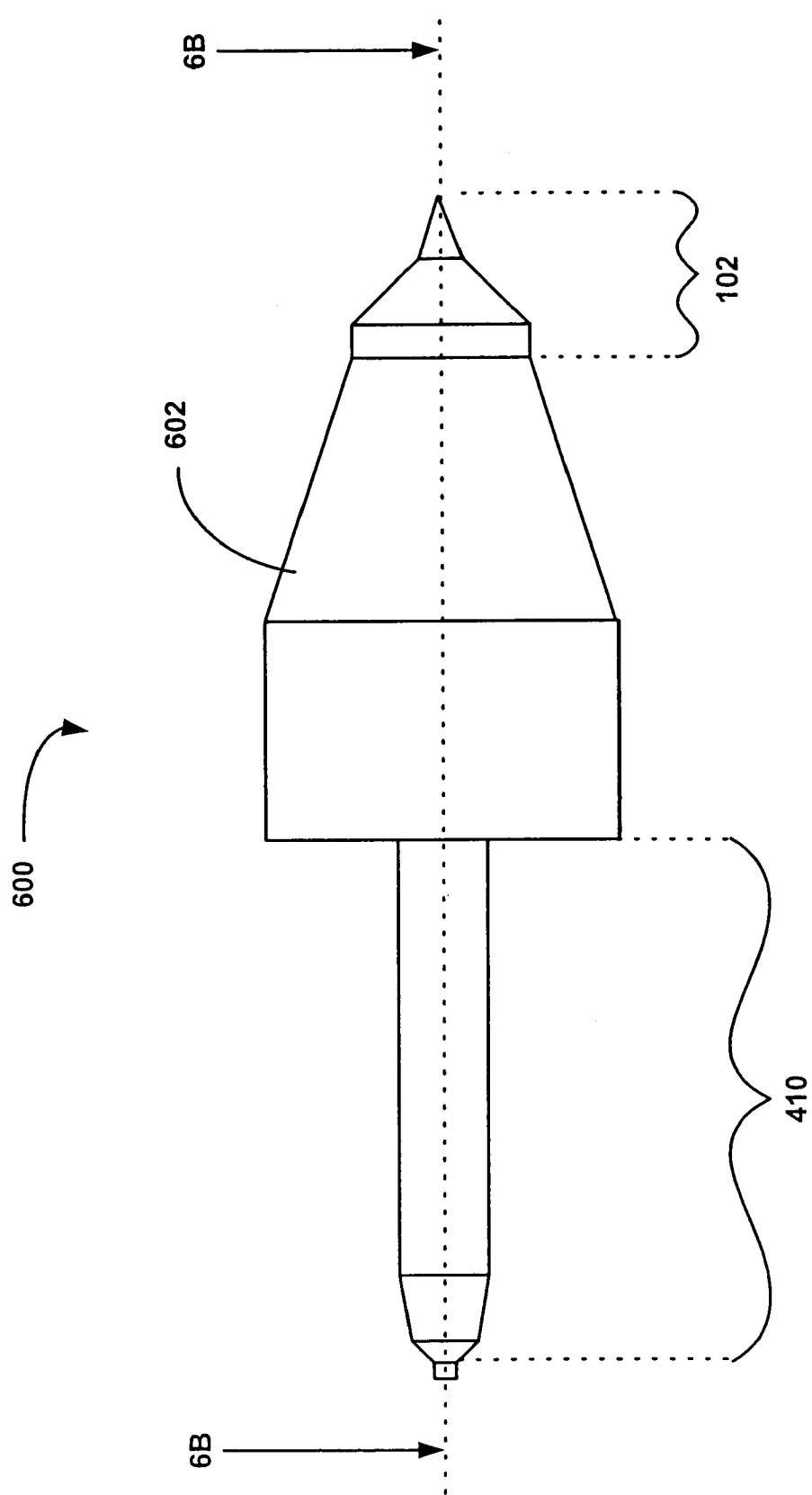

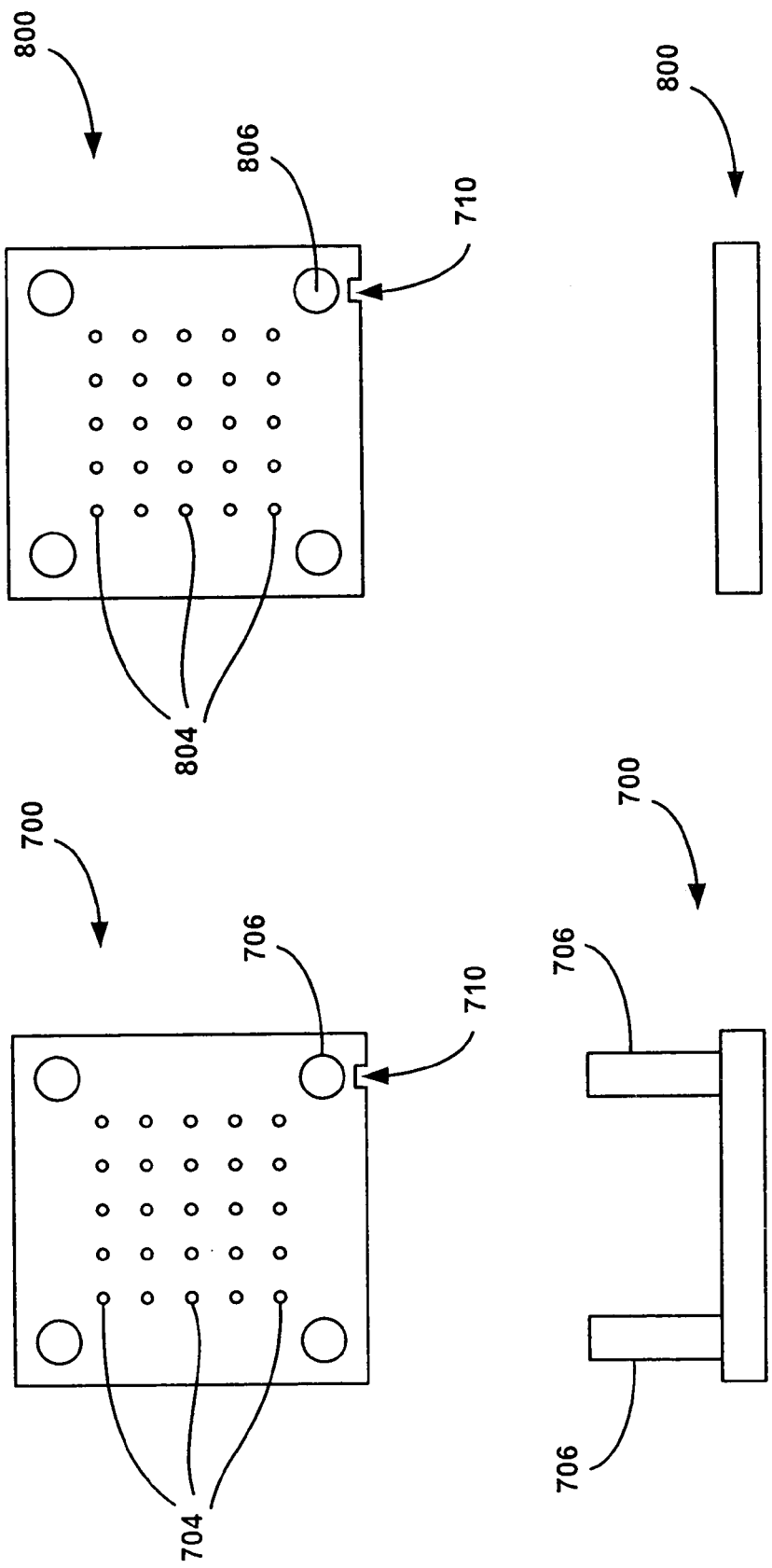

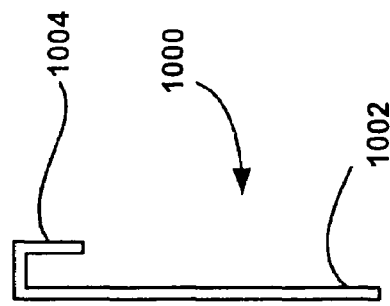
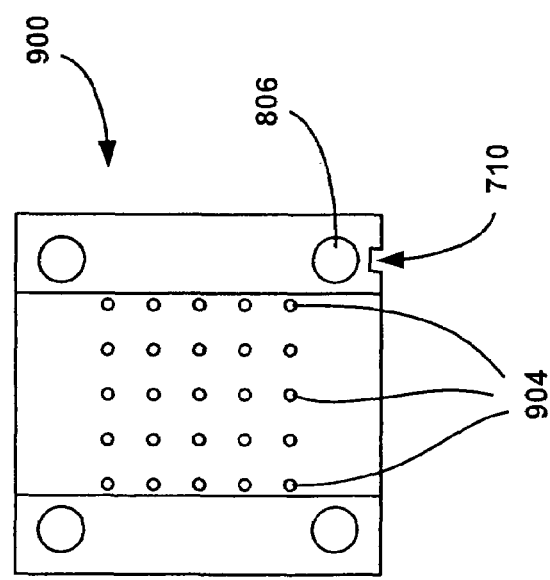
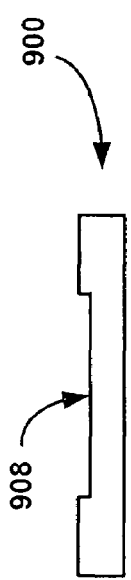
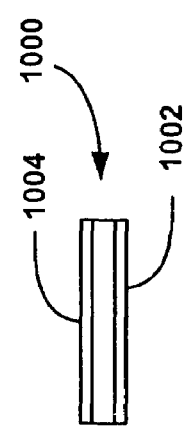

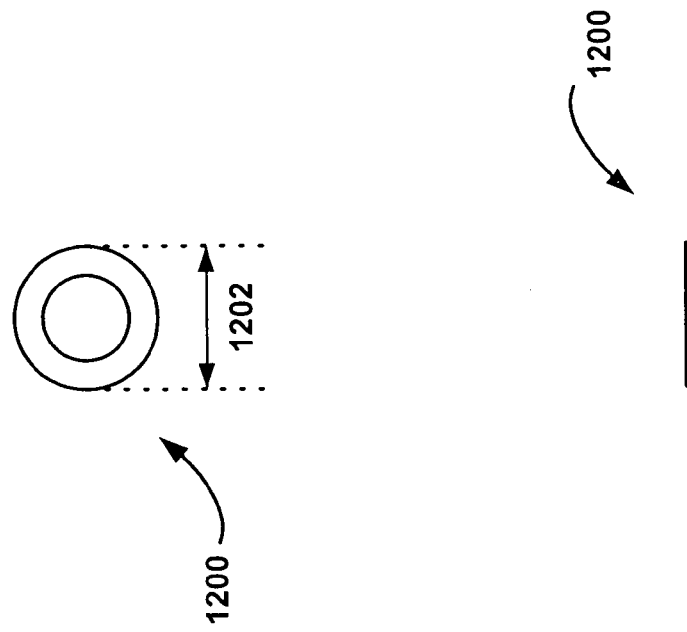
FIG. 12A
FIG. 12B
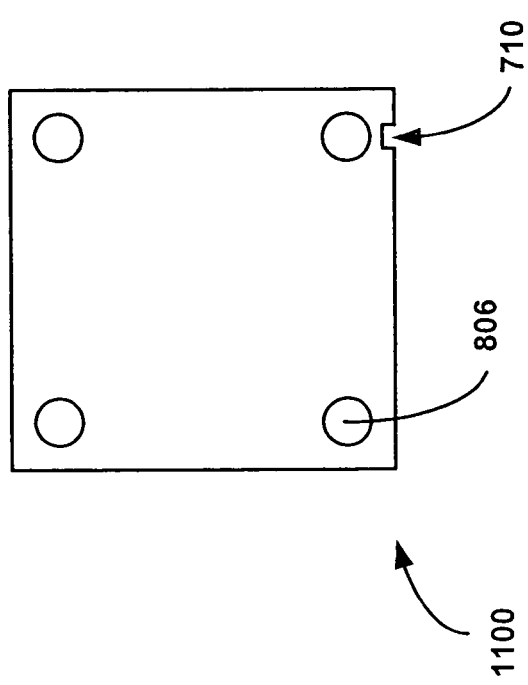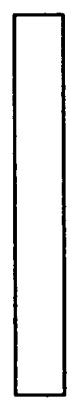
FIG. 11A
FIG. 11B

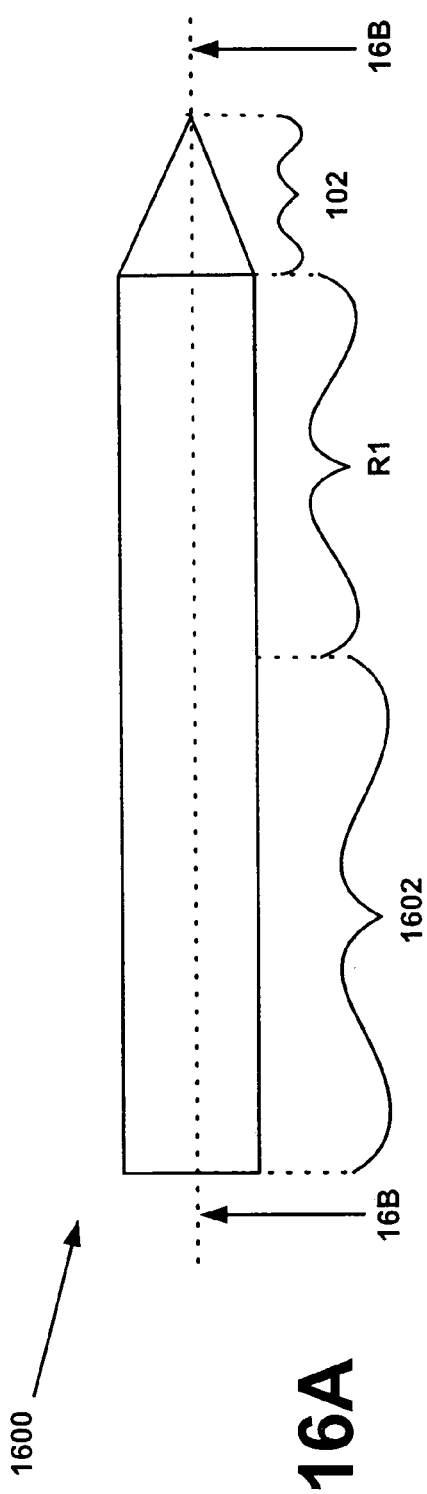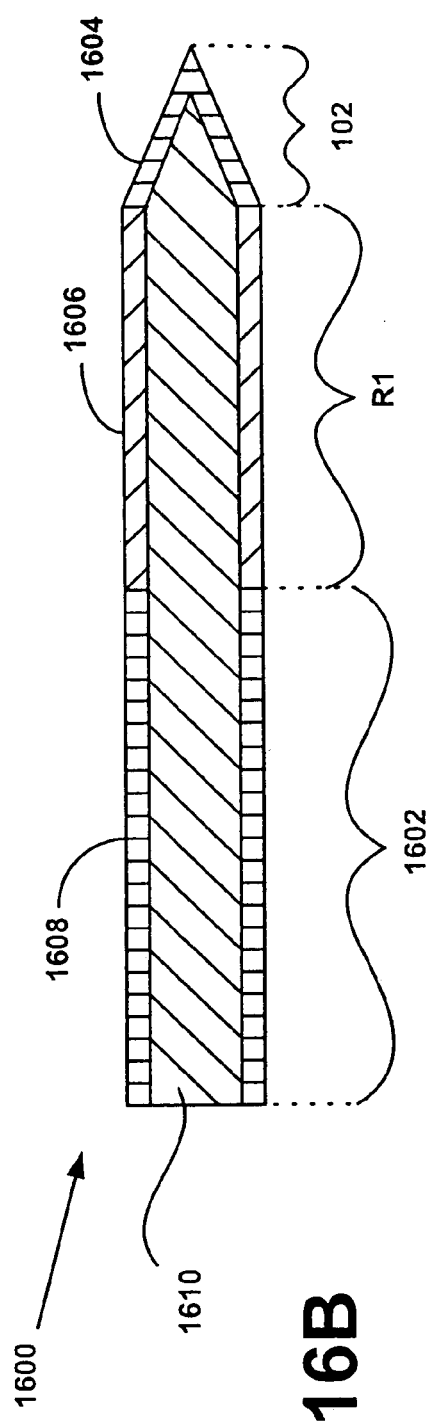
FIG. 16A
FIG. 16B

VOLTAGE PROBE SYSTEMS HAVING IMPROVED BANDWIDTH CAPABILITY

CROSS REFERENCE TO RELATED APPLICATIONS

The present application is a continuation-in-part of U.S. application Ser. No. 10/125,002, filed Apr. 18, 2002, and thereby claims the benefit of the earlier filing date of Apr. 18, 2002 in accordance with 35 U.S.C. §120.

FIELD OF THE INVENTION

This invention relates generally to instrumentation used in the testing and measuring of electrical signals. More specifically, it relates to voltage probe systems having improved fidelity at high frequencies.

DESCRIPTION OF THE RELATED ART

A voltage probe typically uses a metal pin and/or a metal socket to make an electrical connection between a point being probed and an attenuator and/or amplifier circuit in the probe. The electrical connection may be modeled as a short transmission line having a transmission time delay that is dependent on the length of the transmission line. The input impedance of a probe resonates low and the response of a probe resonates high at a frequency determined by the length of the electrical connection and by the impedance at the far end of the connection which is usually dominated by just a capacitance. Although this resonance exists for all probes, lower bandwidth probes may not be adversely affected by the resonance since the resonance may occur at a frequency well above the bandwidth capability of the probe. However, higher bandwidth voltage probes are often affected by this resonance. One way to avoid the resonance problem is to make the pin and/or socket that connect to the probing point very short so that the frequency of the resonance is well above the bandwidth of the probe. The problem with a very short pin and/or socket is that they can make it difficult, if not impossible, to establish connections to testing points that are in "tight" places. Simply put, voltage probes having a very short pin and/or socket are difficult to use. On the other hand, using a longer pin and/or socket makes a probe easier to use but creates a resonance in the input structure that degrades the input impedance and response of the probe. Therefore, there exists a need for systems and methods that address these and/or other problems associated with voltage probes.

SUMMARY OF THE INVENTION

Systems and methods are provided for establishing electrical connections between testing instruments and devices under test. In one embodiment of the invention, a voltage probe includes a pin-head that is configured to contact a device under test, and a resistor that is attached to the pin-head. In another embodiment, a resistive pin for use in a voltage probe includes a pin-head that is configured to contact a test point in a device under test and a resistor that is attached to the pin-head. The resistive pin may be configured such that a signal travel time between the test point and the resistor is less than a time required for the signal to travel 1/10th of a wavelength corresponding to a highest frequency of interest.

BRIEF DESCRIPTION OF THE DRAWINGS

The invention can be better understood with reference to the following drawings. The components in the drawings are not necessarily drawn to scale, emphasis instead being placed upon clearly illustrating the principles of the present invention. In the drawings, like reference numerals designate corresponding parts throughout the several views.

FIGS. 6A and 6B are schematic diagrams depicting a side view and a cross-sectional view, respectively, of a resistive pin that includes the resistive pin shown in FIG. 5.

FIGS. 7A and 7B are schematic diagrams depicting a top view and a side view, respectively, of a first slab used in manufacturing the resistive pin shown in FIG. 5.

FIGS. 8A and 8B are schematic diagrams depicting a top view and a side view, respectively, of a second slab used in manufacturing the resistive pin shown in FIG. 5.

FIGS. 9A and 9B are schematic diagrams depicting a top view and a side view, respectively, of a third slab used in manufacturing the resistive pin shown in FIG. 5.

FIGS. 10A, 10B, and 10C are schematic diagrams depicting a top view, a side view, and an end view, respectively, of a slide used in manufacturing the resistive pin shown in FIG. 5.

FIGS. 11A and 11B are schematic diagrams depicting a top view and a side view, respectively, of a fourth slab used in manufacturing the resistive pin shown in FIG. 5.

FIGS. 12A and 12B are schematic diagrams depicting a top view and a side view, respectively, of a solder washer that may be used to bond a resistor to the pin-head or base of the pin shown in FIG. 4.

FIGS. 16A and 16B are schematic diagrams depicting a side view and a cross-sectional view, respectively, of a resistive pin that may form part of the voltage probe shown in FIG. 1.

DETAILED DESCRIPTION

Systems and methods in accordance with the present invention reduce resonance in voltage probes by placing a damping resistor near a probing point of a voltage probe. In one embodiment of the invention, a resistor is included in a voltage probe such that it is within about 1 or 2 millimeters from a test point that is contacted by the voltage probe. This and other embodiments will be described more fully hereinafter with reference to the accompanying drawings. These embodiments are examples, among others, of systems and methods of the present invention. Therefore, the present invention, which may be embodied in many different forms, should not be construed as limited to the embodiments set forth herein.

Figure 1:
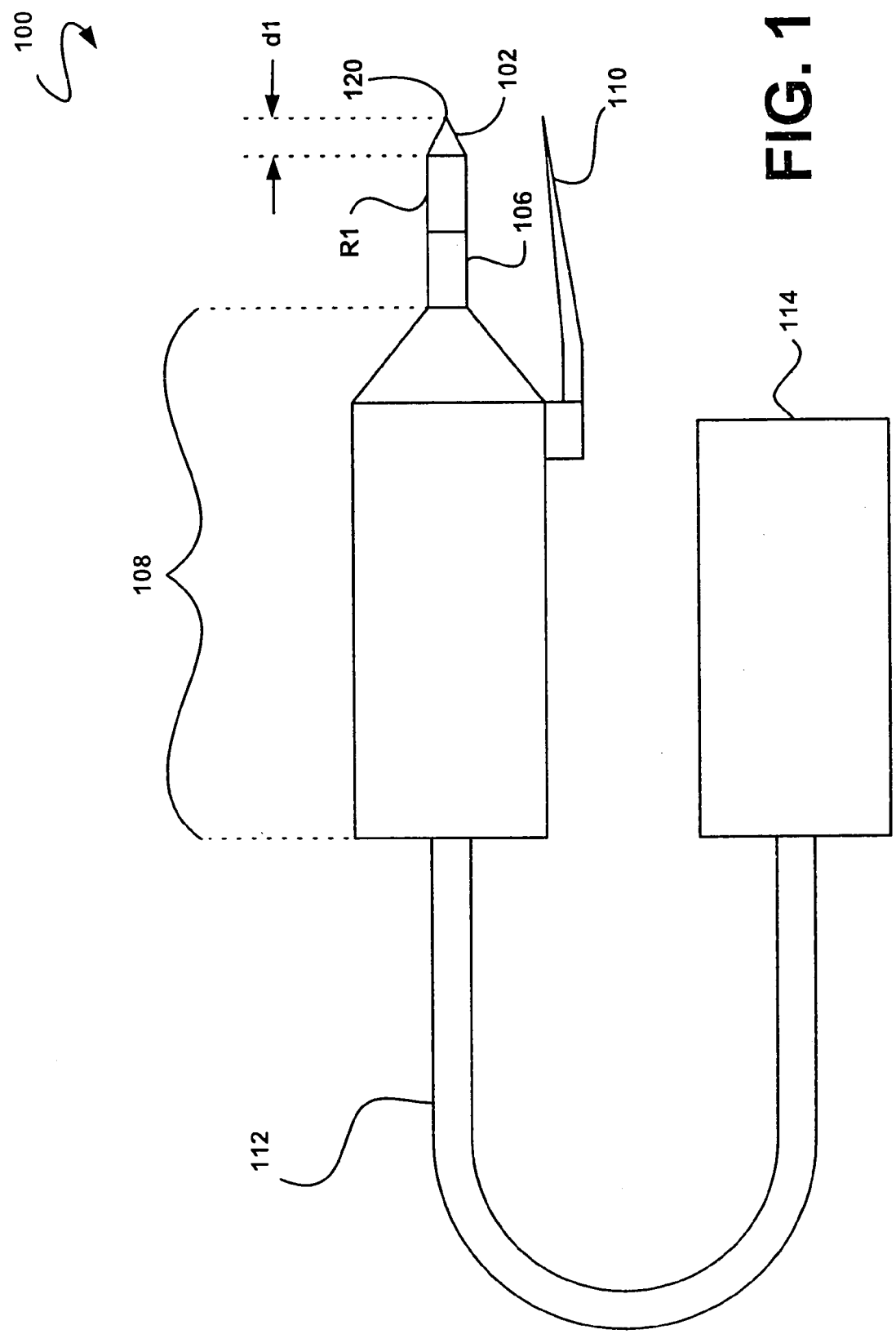
FIG. 1 is a schematic diagram of a voltage probe in accordance with one embodiment of the invention.

FIG. 1 is a schematic diagram of a voltage probe 100 in accordance with one embodiment of the invention. The voltage probe 100 includes a pin-head 102, a damping resistor R1, a handle 108, a cable 112, and a measurement and testing instrument (MTI) interface 114. In one embodiment, the value of the damping resistor R1 is between 50 ohms and 500 ohms. The pin-head 102 is for contacting a test point in a device under test (DUT). The test point is typically contacted via a tip 120 of the pin-head 102. For optimal electrical performance of the voltage probe 100, the length d1 of the pin-head 102 is preferably less than 1 millimeter (mm). However, the voltage probe 100 may be more easily used and manufactured if the length d1 is between 1 mm and 2 mm. In one embodiment, the length d1 may be greater than 2 mm, depending on a desired implementation.

The damping resistor R1 is attached to the pin-head 102 and to a pin shaft (not shown). This pin shaft fits in a socket located within a cylindrical portion 106 and thereby connects the resistor R1 to other voltage probe components located within the handle 108. A ground connector 110, which is connected to the handle 108, is for providing a connection to ground. The MTI interface 114 connects the voltage probe 100 to an MTI (not shown). The cable 112 extends between the handle 108 and the MTI interface 114. Note that other voltage probes having fewer, greater, and/or different components than those shown in FIG. 1 may be implemented within the scope of the present invention. For example, in one embodiment, a wire (not shown) may extend between the cylindrical portion 106 and the resistor R1 in order to facilitate the use of the voltage probe 100. Furthermore, an embodiment of the invention may be implemented in any type of voltage probe, active or passive.

Figure 2:
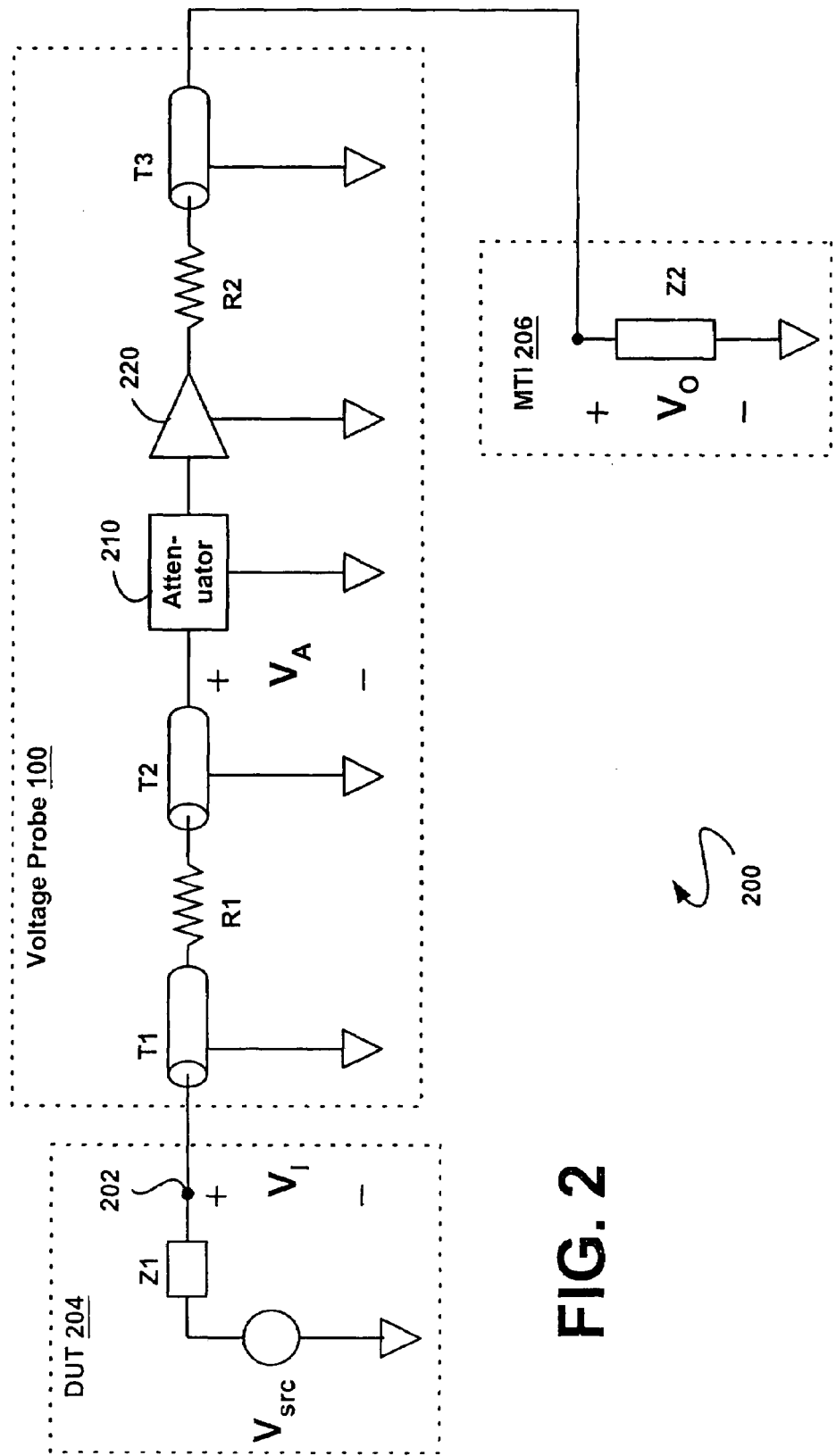
FIG. 2 is a simplified electric circuit diagram representing the voltage probe shown in FIG. 1.

FIG. 2 is a simplified electric circuit diagram of a testing system 200 that includes a voltage probe 100 that is coupled between a DUT 204 and an MTI 206 in accordance with one embodiment. The DUT 204 is modeled as a grounded voltage source Vsrc that is connected in series with a source impedance Z1 and a point being probed 202. The MTI 206 is modeled as a load impedance Z2 that is grounded. In one embodiment, the impedance Z2 is a 50 ohm resistance. The voltage probe 100 includes the following electrical components that are connected in series: a transmission line T1 between the point being probed and the damping resistor R1, a damping resistor R1, a transmission line T2 between the damping resistor R1 and the input attenuator 210, an input attenuator 210, an amplifier 220, an amplifier output resistance R2, and a transmission line T3 between the amplifier output resistance R2 and the MTI 206.

The electrical components of the voltage probe 100 shown in FIG. 2 correspond to physical components of the voltage probe 100 shown in FIG. 1 as follows: the transmission line T1 represents a connection made by the pin-head 102, the damping resistor is shown as R1 in both figures, the transmission line T2 represents a connection made by or within the cylindrical portion 106, and the transmission line T3 represents a connection made by the cable 112 between the handle 108 and the MTI 206. Furthermore, the input attenuator 210 and the amplifier 220 are components that are located within the handle 108.

In order to provide greater improvement in high frequency fidelity, a signal travel time between the point being probed 202 and the resistor R1 (i.e., the time delay across T1) is preferably no more than the time it takes for the signal to travel a length equal to $1/10^{th}$ of a wavelength of a test signal corresponding to the highest frequency test signal of interest. In other words, the length of the transmission line T1, corresponding substantially to the length of the pin-head 102, is preferably less than $1/10^{th}$ the wavelength of the highest frequency test signal that is measured. The wavelength of a signal can be determined by the frequency of the signal by the formula $\lambda = v/f$, where $\lambda$ is the wavelength, v is the velocity of a propagating signal, and f is the frequency. Assuming v=c (the speed of light), then $\lambda = c/f$. In one embodiment, the highest frequency of interest corresponds to the bandwidth rating of the voltage probe. For example, in a voltage probe having a bandwidth, or upper frequency, rating of 4.8 GHz, the resistor R1 is preferably within a signal travel time of about 21 pico seconds (i.e., 0.1 cycle * 1/4.8 GHz), or within 6.3 mm (i.e., the speed of light times 21 pico seconds) from the point being probed 202 (i.e., from the tip 120 of the pin-head 102 (FIG. 1)).

The characteristic impedance of T1 and T2 is as high as reasonably practical. In one embodiment, for example, each of T1 and T2 has a characteristic impedance of approximately 150 Ohms. The time T1 required for a signal to propagate across T1 is substantially less than the time t2 required for a signal to propagate across T2. For example, in one embodiment where the bandwidth rating of the probe is 4.8 GHz, t1 is about 4 pico seconds and t2 is about 40 pico seconds.

The closer that the values of the voltages $V_A$ and $V_I$ are to each other, the better the performance of the voltage probe; i.e., the more accurately $V_O$ can be used to estimate $V_I$. This is because the output voltage $V_O$ is linearly related to the voltage $V_A$. The voltage $V_O$ is equal to the output voltage $V_A$ divided by an attenuation factor (e.g., 10). In the example shown in FIG. 2, the attenuation factor represents the degree of signal attenuation caused by a combination of the attenuator 210 and the amplifier 220. Placing the resistor R1 electrically close (e.g., within a signal travel time of 4 pico seconds) to the point being probed 202 substantially extends the frequency range for which the values of $V_A$ and $V_I$ are close to each other (e.g., within 3 decibels (dB) of each other).

Figure 3A:
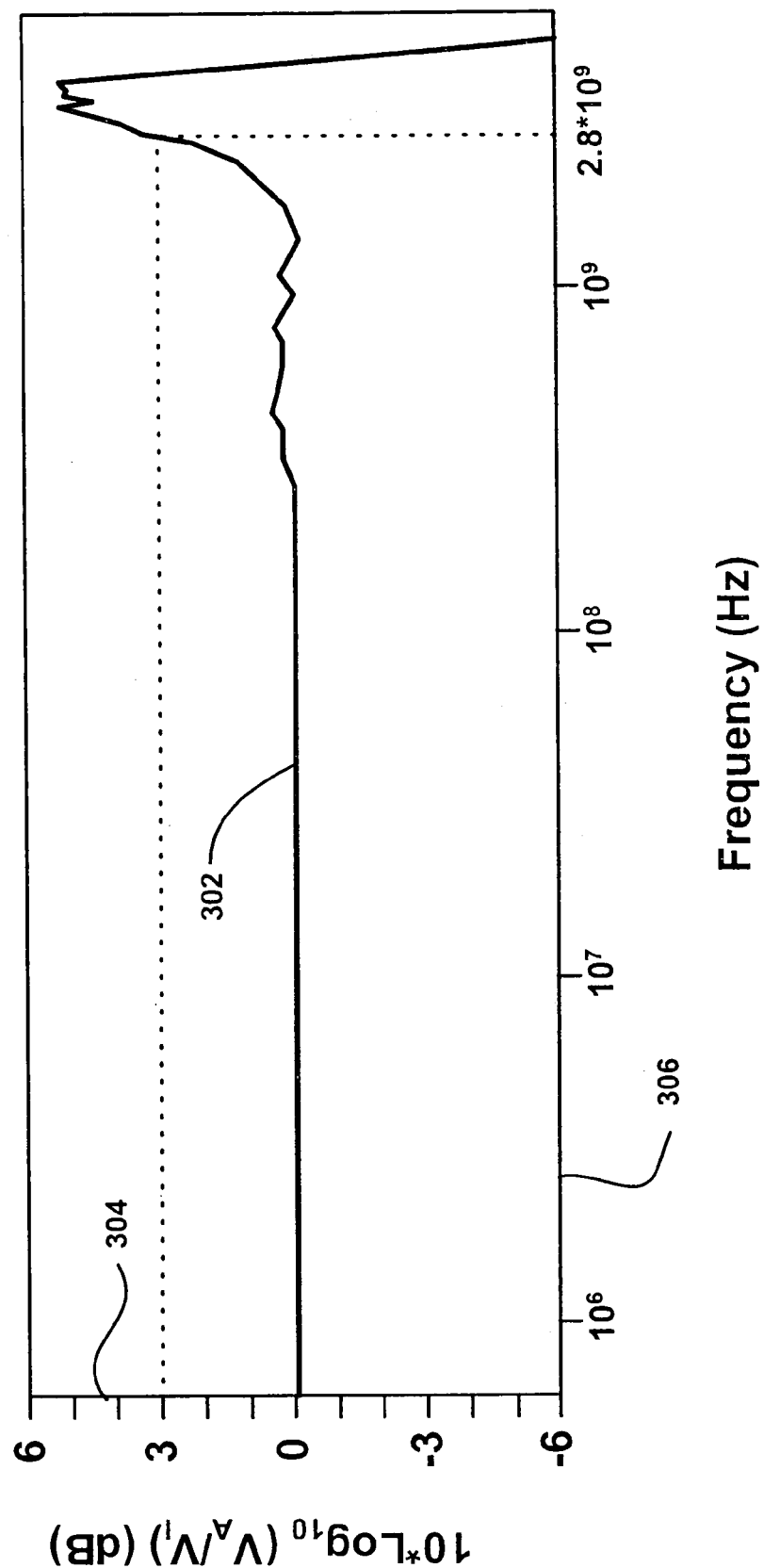
FIG. 3A is a graph depicting a performance characteristic of a prior art voltage probe.

FIG. 3A is a graph depicting a performance characteristic for a prior art voltage probe that does not include a damping resistor located near its probing tip, but that is otherwise similar to the voltage probe 100 (FIG. 1). The vertical axis 304 represents the ratio of $V_A$ (i.e., $V_O$ multiplied by a scaling factor) over $V_I$ (FIG. 2) in decibels. In other words, the vertical axis 304 represents $20*\text{Log}_{10}(V_A/V_I)$. The horizontal axis 306 represents the input signal frequency in Hertz on a logarithmic scale. The line segment 302 represents the ratio of $V_A$ over $V_I$ in dB over a certain frequency range. Note that the ratio of $V_A/V_I$ deviates by 3 dB when the signal frequency reaches only 2.8 GHz. Therefore, the prior art voltage probe will allow for measurements that are at least 70% accurate for only the frequency range of 0–2.8 GHz.

Figure 3B:
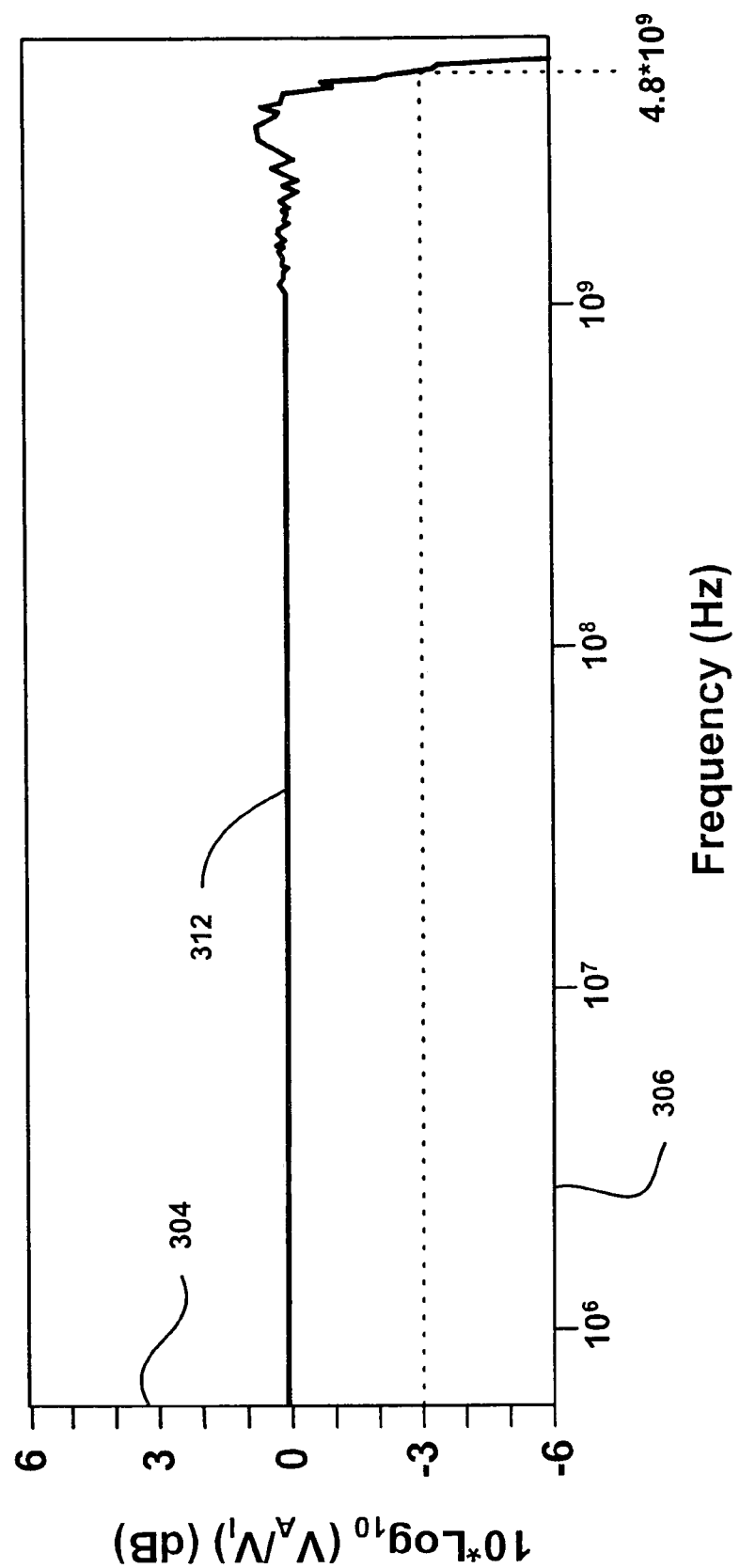
FIG. 3B is a graph depicting a performance characteristic of the voltage probe shown in FIG. 1.

FIG. 3B is a graph depicting a performance characteristic for a voltage probe that includes a damping resistor near its probing tip (e.g., the voltage probe 100 (FIG. 1)). The line segment 312 represents the ratio of $V_A$ over $V_I$ in dB over a certain frequency range. Note that the ratio of $V_A/V_I$ deviates by 3 dB when the signal frequency reaches 4.8 GHz. In other words, the voltage probe 100 will allow for measurements that are at least 70% accurate for the frequency range of 0–4.8 GHz. Therefore, the voltage probe 100 maintains an accuracy of at least 70% at higher frequencies than does an otherwise similar prior art voltage probe that does not include a damping resistor near its probing tip.

Figure 4:
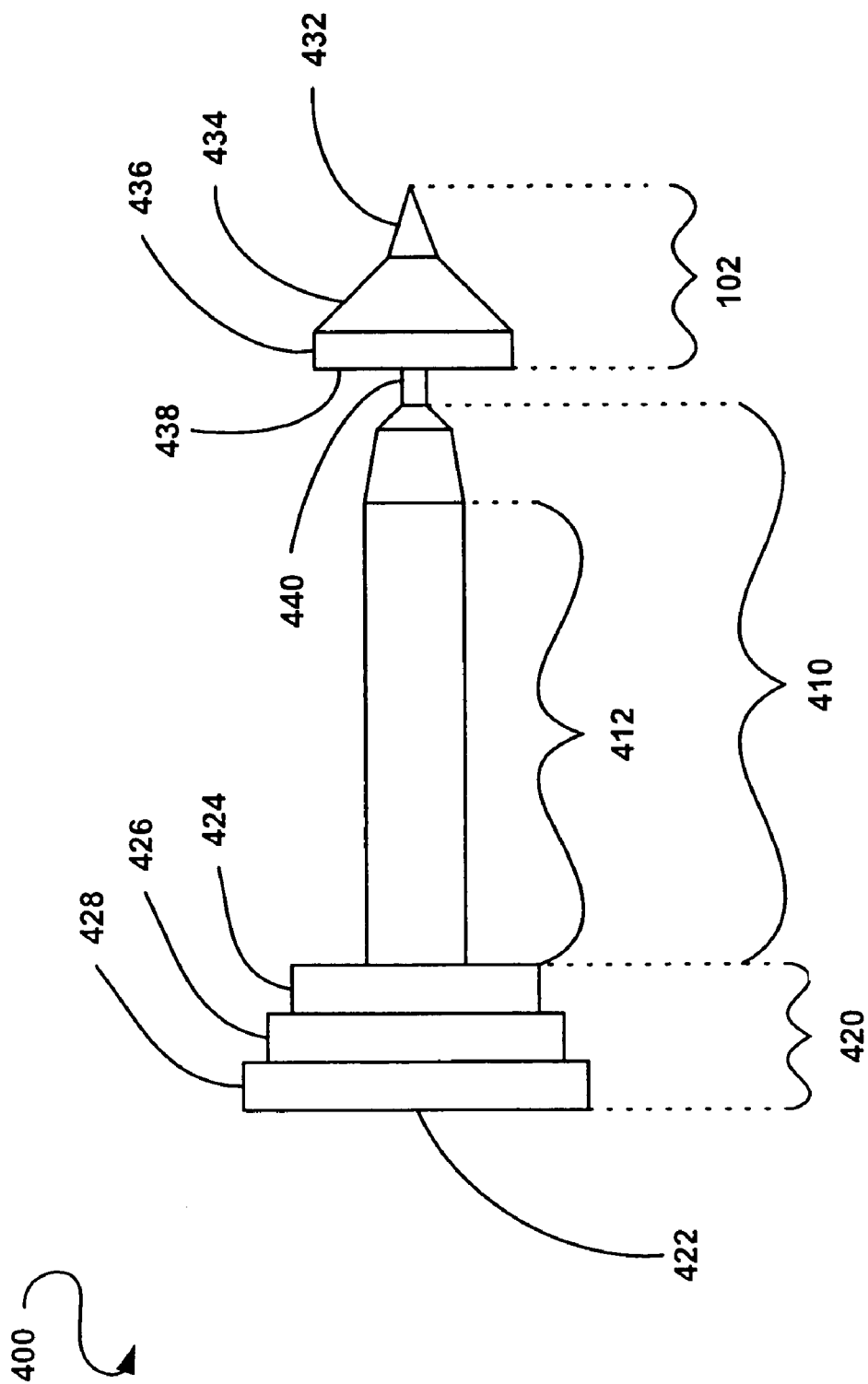
FIG. 4 is a schematic diagram depicting a pin in accordance with one embodiment of the invention.

FIG. 4 is a schematic diagram depicting a pin 400. The pin 400 may be used to form a resistive pin that can be incorporated into a voltage probe. The pin 400 is preferably only a few millimeters (mm) in length. In one embodiment, for example, among others, the pin is about 7 mm long. The exact length of a pin 400 may be determined based on a desired implementation.

The pin 400 includes a shaft 410, a base 420, a pin-head 102, and a neck 440. The shaft 410 extends between the base 420 and the neck 440. The neck 440 extends between the pin-head 102 and the shaft 410, and has a significantly smaller diameter than a diameter of at least a portion of the shaft 410. As a result, the neck 440 can break when a sufficient level of torque is exerted on the pin 400.

Figure 5:
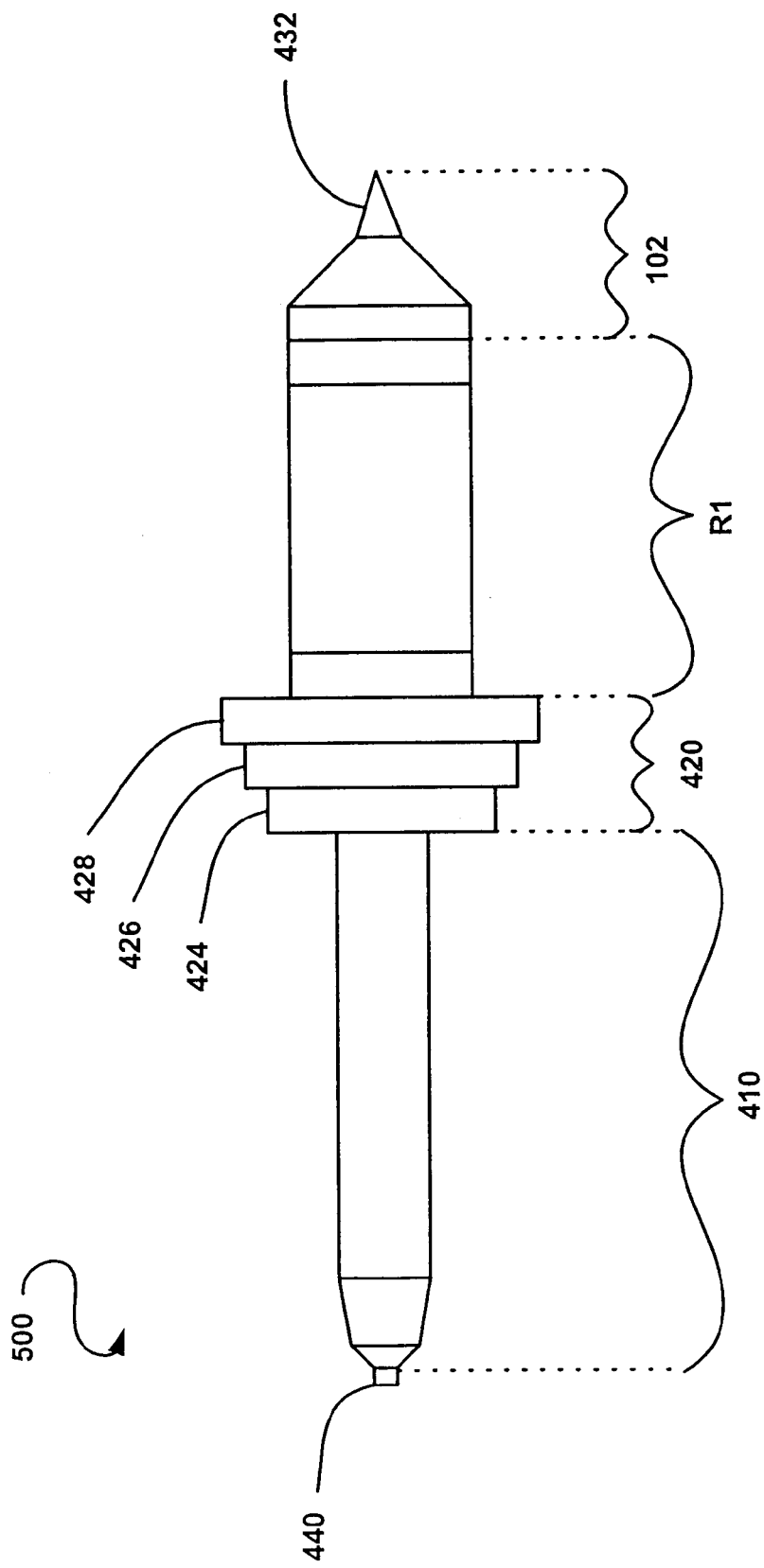
FIG. 5 is a schematic diagram depicting a resistive pin that includes the pin shown in FIG. 4.

FIG. 5 is a schematic diagram depicting a resistive pin 500. The pin-head 102 includes a pointed tip 432 for contacting an electrical test point, and a conical portion 434 that extends from the pointed tip 432. The combination of the pointed tip 432 and the conical portion 434 is durable and helps to provide good visibility of an electrical test point during testing. The pin-head 102 and the base 420 include substantially flat surface areas 438 and 422, respectively, that are configured to bond to a resistor via, for example, but not limited to, soldering material.

The base 420 may include three cylindrical portion having different diameters: a first cylindrical portion 424 is for fitting within a voltage probe socket, a second cylindrical portion 426 is for contacting an area surrounding an opening of the voltage probe socket, and a third cylindrical portion 428 is for helping to secure a protective cast that is applied over resistor R1 during the manufacturing of a resistive pin.

In one embodiment, the pin may comprise a Beryllium-copper (BeCu) alloy and may be shaped using a numerically controlled lathe. Other conductive materials may also be used. However, one advantage of using a BeCu alloy is that it can be relatively soft and therefore easy to shape. Furthermore, after the BeCu is shaped, it may then be heat treated to substantially increase its durability.

The exact dimensions of the pin 400 may be responsive to a desired implementation. For example, the diameter of a cylindrical portion 436 of the pin-head 102 may be selected to equal a diameter of a resistor that is to be attached to the substantially flat surface area 438. Furthermore the diameters of the shaft 410 and of a first portion 424 of the base 420 may be selected such that the parts can properly fit within a socket of a desired voltage probe.

It is desirable to keep the length of the pin-head 102 very short (e.g., less than or equal to 1 mm) in order to optimize the performance of a voltage probe for ultra-high and super-high frequency applications. However, it may be more practical to manufacture and use a resistive pin having a pin-head 102 that is slightly longer than 1 mm (e.g., between 1 mm and 2 mm) without significantly departing from optimal performance. For example, in one embodiment, the length of the pin-head 102 is about 1.25 mm.

FIG. 5 is a schematic diagram depicting a resistive pin 500. The resistive pin 500 is assembled after the neck 440 (FIG. 4) is broken to separate the shaft 410 from the pin-head 102. When the neck 440 is broken, a portion of it may remain connected to the pin-head 102 and another portion may remain connected to the shaft 410. The resistive pin 500 includes the pin-head 102, the base 420 and the shaft 410 of the pin 400. A resistor R1 is attached to the substantially flat surface area 438 of the pin-head 102 and to the substantially flat surface area 422 of the base 420 (FIG. 4) via solder. Note that the resistive pin 500 may include a pin-head 102 corresponding to a first pin 400 and a shaft 410 and base 420 corresponding to a second pin 400.

Figure 6B:
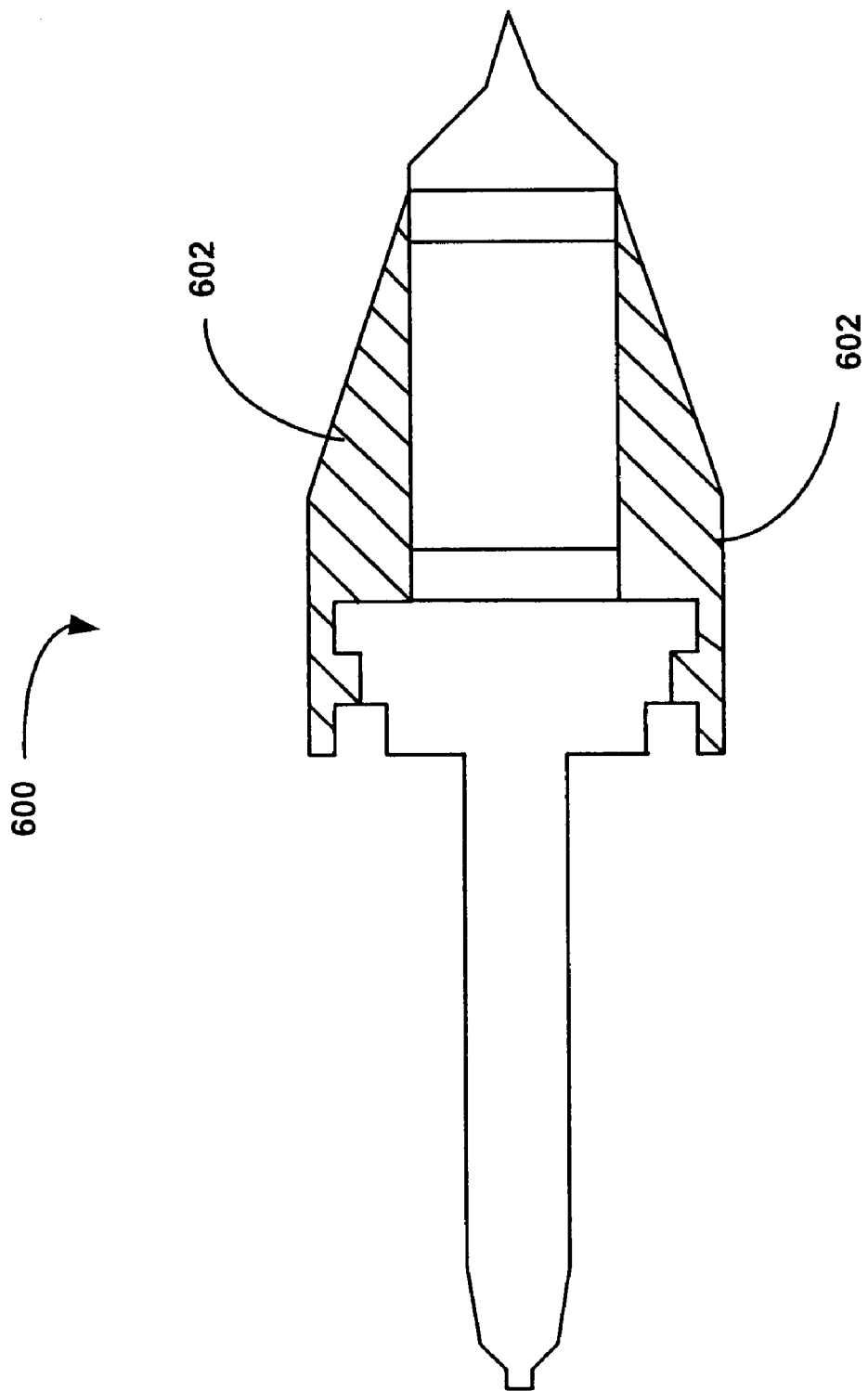

FIGS. 6A and 6B are schematic diagrams depicting a side view and a cross-sectional view, respectively, of a resistive pin 600. The resistive pin 600 includes the resistive pin 500 (FIG. 5) and a cast 602 that covers a portion of the resistive pin 500. The cast 602 makes the resistive pin 600 more durable and more resistant to breaking. The cast 602, which may be molded over the resistive pin 500, may comprise an insulating material such as, for example, but not limited to, plastic. After the resistive pin 600 is formed, it may be connected to a voltage probe by placing the shaft 410 into a socket of the voltage probe.

FIGS. 7A and 7B are schematic diagrams depicting a top view and a side view, respectively, of a first slab 700 used in manufacturing the resistive pin 500 (FIG. 5). The first slab 700 has holes 704 formed therein for receiving pin-heads such as, for example, the pin-head 102 (FIG. 4). The first slab 700 also has alignment pins 706 extending therefrom. Each of the alignment pins 706 is located near a corner of the first slab 700 and is configured to fit through alignment holes provided in other slabs that are to be placed above the first slab 700. The first slab 700 also has an alignment notch 710 that helps to align the first slab 700 with the other slabs.

FIGS. 8A and 8B are schematic diagrams depicting a top view and a side view, respectively, of a second slab 800 used in manufacturing the resistive pin 500 (FIG. 5). The second slab 800 has holes 804 formed therein for receiving resistors, such as, for example, the resistor R1 (FIG. 5). The second slab 800 also has alignment holes 806. Each alignment hole 806 is located near a corner of the second slab 800 and is configured to receive one of the alignment pins 706 that extends from the first slab 700 (FIG. 7).

FIGS. 9A and 9B are schematic diagrams depicting a top view and a side view, respectively, of a third slab 900 used in manufacturing the resistive pin 500 (FIG. 5). The third slab 900 has holes 904 formed therein for receiving the body of a pin such as for example, the shaft 410 and the base 420 of the pin 400 (FIG. 4). The third slab 900 also has alignment holes 806 and a slot 908. Each alignment hole 806 is located near a corner of the third slab 900 and is configured to receive one of the alignment pins 706 that extends from the first slab 700 (FIG. 7). The slot 908 is configured to receive a slide that is configured to keep the shaft 410 and base 420 within the third slab 900 while the third slab 900 is being turned upside down.

FIGS. 10A, 10B, and 10C are schematic diagrams depicting a top view, a side view, and an end view, respectively, of a slide 1000 used in manufacturing the resistive pin 500 (FIG. 5). A first portion 1002 of the slide 1000 is configured to slide into the slot 908 of the third slab 900. A second portion 1004 of the slide 1000 is configured to slide on an opposing side of the third slab 900.

FIGS. 11A and 11B are schematic diagrams depicting a top view and a side view, respectively, of a fourth slab 1100 used in manufacturing the resistive pin 500 (FIG. 5). The fourth slab 1100 has alignment holes 806 extending therethrough. Each alignment hole 806 is located near a corner of the fourth slab 1100 and is configured to receive one of the alignment pins 706 that extends from the first slab 700 (FIG. 4). The fourth slab 1100 is relatively heavy and is used to provide pressure on resistor-pin assemblies positioned within a slab assembly that includes the four slabs 700, 800, 900, and 1100.

FIGS. 12A and 12B are schematic diagrams depicting a top view and a side view, respectively, of a solder washer

1200 that may be used to bond a resistor R1 to a pin-head 102 or to a base 420. The solder washer 1200, which includes solder, is very thin. In one implementation, for example, the solder washer is about ⅒ of a millimeter thick, and has an exterior diameter 1202 that is equal to the diameter of the cylindrical portion 436 of the pin-head 102 (FIG. 4). Furthermore, the solder washer 1200 is preferably coated with a solid layer of flux to facilitate the flowing of solder and to help prevent formation of oxides during the soldering process.

Figure 13:
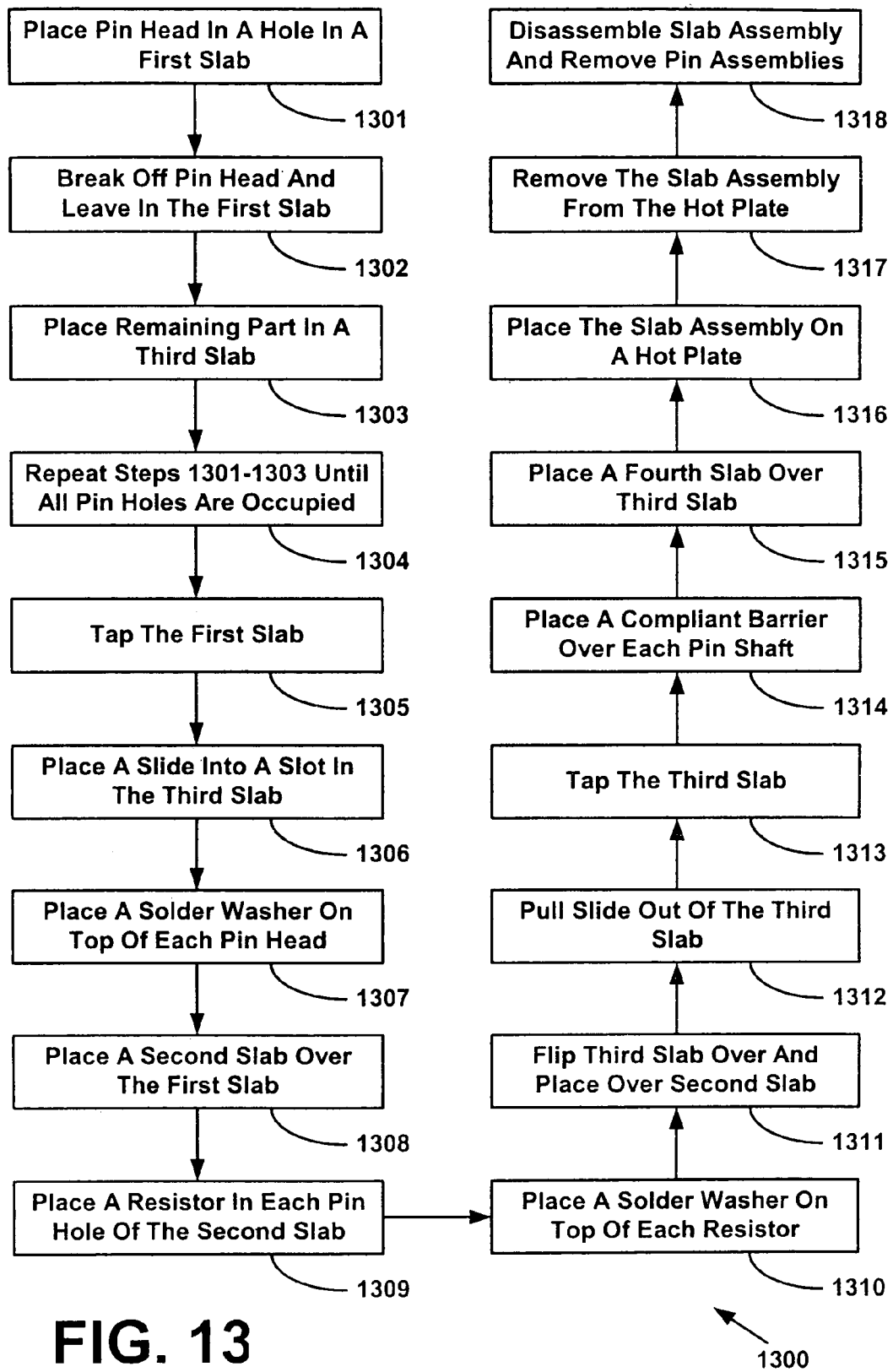
FIG. 13 is a flow chart depicting a method for manufacturing a resistive pin shown in FIG. 5, in accordance with one embodiment of the invention.

FIG. 13 is a flow chart depicting a method for manufacturing a resistive pin 500 (FIG. 5). As indicated in block 1301, a pin-head 102 that is part of a pin 400 (FIG. 4) is placed in a pin hole in a first slab 700 (FIG. 7A). The pin-head 102 is then broken off from the remainder of the pin and is left in the first slab 700 (block 1302). The remainder of the pin (e.g., the shaft 410 and the base 420) is placed in a third slab 900 (FIG. 9A) with the base 420 facing up (block 1303). The steps indicated in blocks 1301–1303 are repeated until all the pin holes for receiving pin portions are occupied (block 1304). After all such pin holes are occupied, the first slab 700 may be tapped (block 1305) to insure that the pin-heads 102 are settled into the pin holes in the first slab 700.

A first portion 1002 of a slide 1000 (FIG. 10A) is placed into the slot 908 in the third slab 900 (block 1306) to help ensure that the pin portions inside the third slab 900 do not fall out when the third slab 900 is turned upside down. Furthermore, a solder washer 1200 (FIG. 12) is placed on top of each pin-head 102 in the first slab 700 (block 1307). The solder washers 1200 are for bonding the pin-heads 102 with respective resistors that are to be positioned over the pin-heads 102.

After the solder washers 1200 are placed on top of respective pin-heads 102, the second slab 800 (FIG. 8A) is placed over the first slab 700 (block 1308). The alignment pins 706 are placed through the alignment holes 806 of the second slab 800 in order to align the two slabs. Furthermore, the first slab 700 and the second slab 800 are positioned relative to each other such that alignment notches 710 in the two slabs are aligned.

After the second slab 800 is placed over the first slab 700, a resistor is placed in each of the pin holes of the second slab 800 (block 1309) and a solder washer is placed over each of the resistors (block 1310). The third slab 900 is then turned upside down and is placed over the second slab 800 (block 1311). The alignment pins 706 are placed through the alignment holes 806 of the third slab 900 in order to align the third slab 900 with the second slab 800. Furthermore, the second slab 800 and the third slab 900 are positioned relative to each other such that alignment notches 710 in the two slabs are aligned.

The slide 1000 that was inserted into the slot 908 of the third slab 900 is then removed (block 1312) so that the bases of the pins contained in the third slab 900 come into contact with respective solder washers 1200 located on top of the resistors in the second slab 800. The third slab 900 may also be tapped (block 1313) to insure that the bases settle onto the solder washers 1200.

A compliant barrier is placed over the necks 440 extending from pin shafts 410 positioned through pin holes in the third slab 900 (block 1314). The compliant barrier may comprise, for example, but not limited to, rubber. Then, as indicated in block 1315, the fourth slab 1100 (FIG. 11A) is placed over the third slab 900 in order to apply pressure on resistor-pin assemblies located within the slab assembly. The alignment pins 706 are placed through the alignment holes 806 of the fourth slab 1100 in order to align the fourth slab 1100 with the third slab 900. Furthermore, the fourth slab 1100 and the third slab 900 are positioned relative to each other such that alignment notches 710 in the two slabs are aligned.

The compliant barrier transfers pressure applied by the fourth slab 1100 (FIG. 11A) to a corresponding resistive pin. This pressure helps to ensure that components of the resistive pin are firmly pressed against each other during a soldering process. In the absence of the compliant barrier, pin assemblies that are slightly shorter than others may receive little or no pressure from the fourth slab 1100.

The slab assembly that includes the four slabs is then placed on a hot plate (block 1316) in order to melt the solder washers 1200. The slab assembly is then removed from the hot plate and is allowed to cool (block 1317). Cooling the slab causes the resistors to bond with respective pin-heads 102 and pin bases that are positioned within the slab assembly. After the slab assembly has cooled enough to be handled, it is disassembled and the resistor-pin assemblies 500 are removed therefrom (block 1318).

Figure 14:
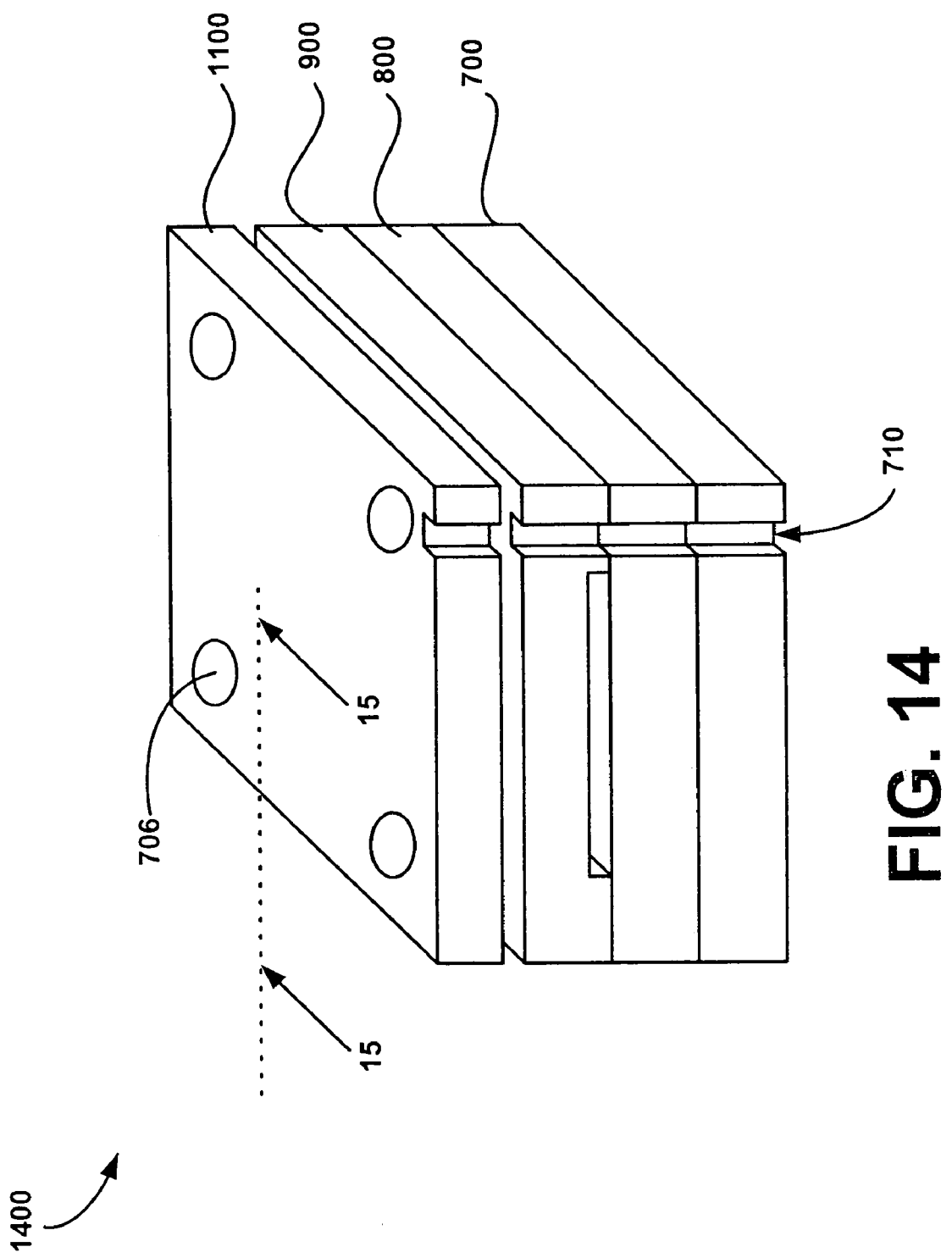
FIG. 14 is a schematic diagram illustrating a perspective view of a slab assembly that includes components shown in FIGS. 7–8.

FIG. 14 is a schematic diagram illustrating a perspective view of a slab assembly 1400. The slab assembly 1400 includes a first slab 700, a second slab 800, a third slab 900, and a fourth slab 1100. The slabs 700, 800, 900, and 1100 preferably comprise titanium which resists bonding to solder. Alignment pins 706 and alignment notches 710 help to ensure that the slabs are properly aligned.

Figure 15:
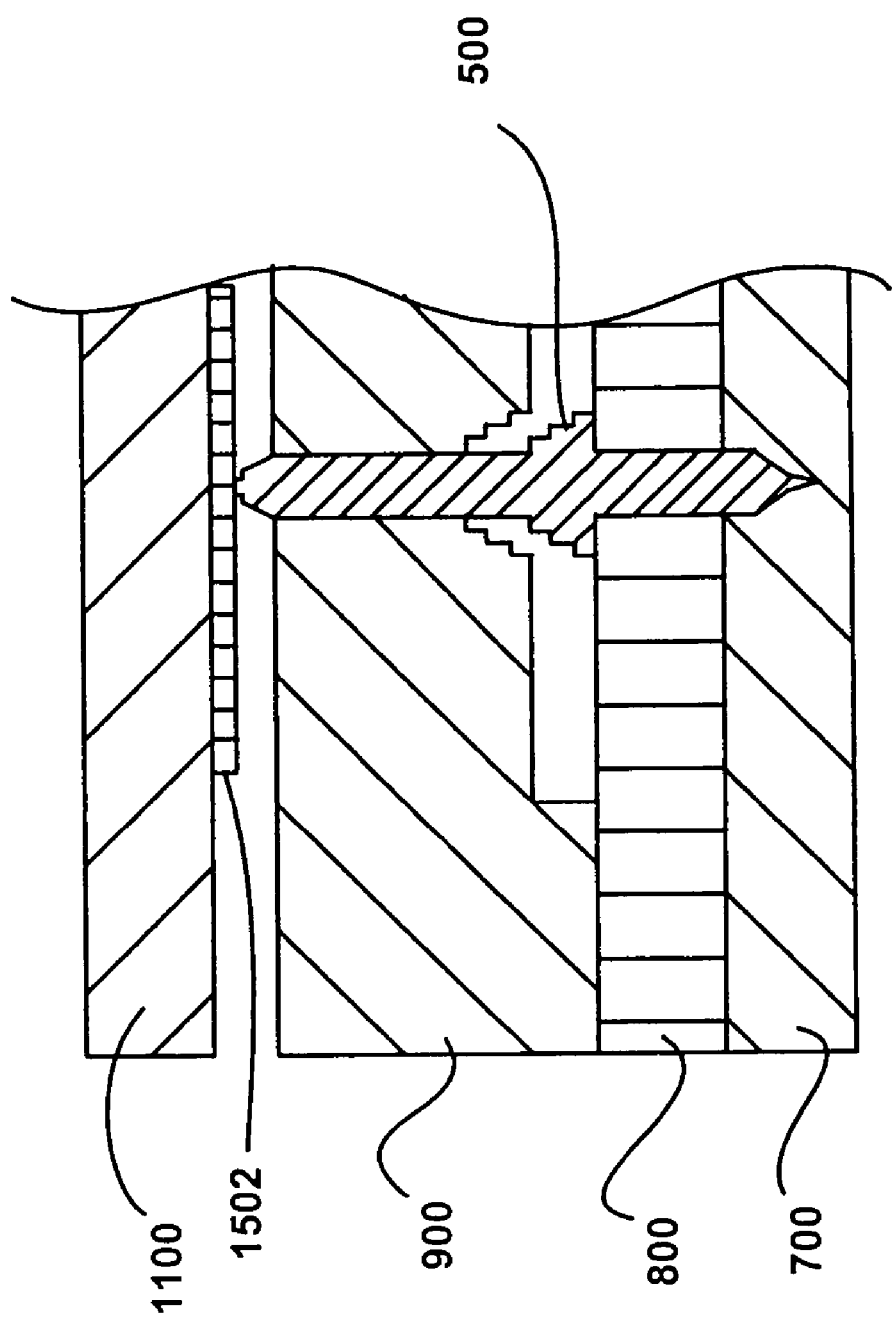
FIG. 15 is a schematic diagram illustrating a partial cross-sectional view of the slab assembly shown in FIG. 14.

FIG. 15 is a schematic diagram illustrating a partial cross-sectional view of the slab assembly 1400. The slab assembly 1400 includes a resistive pin 500 and a compliant barrier 1502 that is positioned between the resistive pin 500 and the fourth slab 1100. The fourth slab 1100 applies pressure on the resistive pin 500 via the compliant barrier 1502. This pressure helps to ensure that components of the resistive pin 500 are firmly pressed against each other during a soldering process. The soldering process includes heating the slab assembly 1400 in order to melt solder that is located between components of the resistive pin 500.

FIGS. 16A and 16B are schematic diagrams depicting a side view and a cross-sectional view, respectively, of a resistive pin 1600 that may form part of a voltage probe 100 (FIG. 1). The resistive pin 1600 is an alternative embodiment to the resistive pin 500 shown in FIG. 5. The resistive pin 1600 includes a pin-head 102, a resistor R1, and a shaft 1602 that each comprise a respective portion of a dielectric pin 1610. The dielectric pin 1610 may comprise a nonconductive material such as, for example, ceramic, glass, or porcelain, among others.

The pin-head 102, which may be used to contact an electrical test point, includes a highly conductive layer 1604 that is applied to an exterior portion of the dielectric pin 1610. The highly conductive layer 1604 may comprise a conductive material such as, for example, copper or an alloy thereof. However, the conductive layer 1604 preferably includes highly conductive diamond which can make the pin-head 102 very durable.

The resistor R1 includes a low-conductivity layer 1606 that is applied to an exterior portion of the dielectric pin 1610. The low-conductivity layer 1606 is less conductive than the highly conductive layer 1604, but is still capable of conducting an electric signal between the pin-head 102 and the shaft 1602. The low-conductivity layer 1606 may comprise, for example, among others, low-conductivity diamond which can make the resistor R1 durable and scratch resistant.

The shaft 1602, which may be partially or fully inserted into a voltage probe socket, includes a highly conductive layer 1608 that is applied to an exterior portion of the dielectric pin 1610. The highly conductive layer 1604 may comprise a conductive material such as, for example, copper or an alloy thereof. However, the conductive layer 1604 preferably has the same composition as the highly conductive layer 1604 in order to help reduce the manufacturing cost of the resistive pin 1600.

It should be emphasized that the above-described embodiments of the present invention are merely possible examples, among others, of the implementations, setting forth a clear understanding of the principles of the invention. Many variations and modifications may be made to the above-described embodiments of the invention without departing substantially from the principles of the invention. All such modifications and variations are intended to be included herein within the scope of the disclosure and present invention and protected by the following claims.

What is claimed is:

1. A high frequency voltage probe comprising:
   a socket;
   a dielectric pin;
   a first layer of high-conductivity material that is in contact with a first portion of the dielectric pin, the first layer being configured to contact a test point in a device under test;
   a second layer of high-conductivity material that is in contact with a second portion of the dielectric pin; and
   a third layer of low-conductivity material that is in contact with a third portion of the dielectric pin;
   the third portion being located between the first portion and the second portion;
   the first layer and the second layer being in contact with the third layer;
   wherein a shaft comprises the second portion and the second layer; and
   wherein at least a portion of the shaft is located in the socket and is slidably removable from the socket;
   wherein the high frequency voltage probe is configured to be attached to a measurement and testing instrument (MTI) and to enable the MTI to determine a voltage level for a signal that is received by the high frequency voltage probe from the test point; and
   wherein the high frequency voltage probe is configured to enable the MTI to determine a voltage level for said signal with at least a 70% accuracy, said signal having a frequency of over 3 gigahertz.

2. The high frequency voltage probe of claim 1, wherein a distance between the test point and the third layer via the first layer is less than a length equal to 1/10th of a wavelength of said signal.

3. The high frequency voltage probe of claim 2, wherein a length of the first portion is less than 2 millimeters.

4. The high frequency voltage probe of claim 3, wherein the length of the first portion is about 1 millimeter.

5. The high frequency voltage probe of claim 1, wherein the third layer is attached to the first layer via a first bonding material having a different composition than the first layer.

6. The high frequency voltage probe of claim 5, wherein the first bonding material is solder.

7. The high frequency voltage probe of claim 5, wherein the second layer is attached to the third layer via a second bonding material.

8. The high frequency voltage probe of claim 1, further comprising a fourth portion configured to provide a connection to ground, wherein connecting the fourth portion to ground enables the MTI to determine a voltage level for said high frequency signal.

9. The high frequency voltage probe of claim 1, further comprising an attenuator configured to attenuate the high frequency signal.

10. The high frequency voltage probe of claim 1, further comprising an amplifier configured to amplify the high frequency signal.

11. The high frequency voltage probe of claim 1, wherein the time taken for the high frequency signal to travel between the test point and the third layer via the first layer is less than 4 pico seconds.

12. The high frequency voltage probe of claim 1, further comprising a coaxial cable configured to conduct the signal from the socket to the MTI.

* * * * *